(12) United States Patent
Horch

(10) Patent No.: US 7,400,255 B2
(45) Date of Patent: Jul. 15, 2008

(54) WIRELESS FUNCTIONAL TESTING OF RFID TAG

(75) Inventor: Andrew E. Horch, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 158 days.

(21) Appl. No.: 11/069,515

(22) Filed: Feb. 28, 2005

(65) Prior Publication Data

US 2006/0206277 A1    Sep. 14, 2006

(51) Int. Cl.
*G08B 13/14*    (2006.01)
(52) U.S. Cl. ............... 340/572.7; 324/765; 340/10.1
(58) Field of Classification Search ........... 340/572.7, 340/572.4, 572.1, 10.1, 505; 235/438; 29/593; 324/500, 537, 765; 714/724; 702/117
See application file for complete search history.

(56) References Cited

U.S. PATENT DOCUMENTS

| | | | |
|---|---|---|---|
| 4,495,628 A | 1/1985 | Zasio | |
| 4,495,629 A | 1/1985 | Zasio | |
| 4,912,709 A | 3/1990 | Teske et al. | |
| 4,969,148 A | 11/1990 | Nadeau-Dostie et al. | |
| 5,003,204 A | 3/1991 | Cushing et al. | |
| 5,053,700 A | 10/1991 | Parrish | |
| 5,130,568 A | 7/1992 | Miller et al. | |
| 5,254,942 A | 10/1993 | D'Souza et al. | |
| 5,257,223 A | 10/1993 | Dervisoglu | |
| 5,355,369 A | 10/1994 | Greenberger et al. | |
| 5,648,661 A | 7/1997 | Rostoker et al. | |
| 5,689,517 A | 11/1997 | Ruparel | |
| 5,831,330 A | 11/1998 | Chang | |
| 6,070,252 A | 5/2000 | Xu et al. | |
| 6,104,291 A | 8/2000 | Beauvillier et al. | |
| 6,122,762 A | 9/2000 | Kim | |
| 6,137,155 A | 10/2000 | Seshan et al. | |
| 6,236,223 B1 * | 5/2001 | Brady et al. ............... 324/765 |
| 6,249,227 B1 * | 6/2001 | Brady et al. ............. 340/572.1 |
| 6,357,025 B1 | 3/2002 | Tuttle | |
| 6,380,729 B1 | 4/2002 | Smith | |
| 6,404,684 B2 | 6/2002 | Arimoto et al. | |
| 6,412,086 B1 | 6/2002 | Friedman et al. | |
| 6,412,786 B1 | 7/2002 | Pan | |
| 6,426,904 B2 | 7/2002 | Barth et al. | |
| 6,525,410 B1 | 2/2003 | Geisomini et al. | |
| 6,563,751 B1 | 5/2003 | Wu | |
| 6,566,736 B1 | 5/2003 | Ogawa et al. | |
| 6,666,380 B1 | 12/2003 | Suzuya | |
| 6,727,722 B2 | 4/2004 | Whetsel | |
| 6,774,470 B2 | 8/2004 | Yagi et al. | |
| 6,806,494 B2 | 10/2004 | Fenner et al. | |
| 6,838,773 B2 | 1/2005 | Kikuchi et al. | |

(Continued)

OTHER PUBLICATIONS

Impinj, Inc., Products, *How RFID Works*, pp. 2, printed Apr. 30, 2004, www.impinj.com/products/rfid/applications.php.

(Continued)

*Primary Examiner*—Thomas Mullen
(74) *Attorney, Agent, or Firm*—Blakely, Sokoloff, Taylor & Zafman LLP

(57) ABSTRACT

Wirelessly testing an RFID tag before it is packaged or otherwise entered into a process reserved for "working" RFID tags is described. Various processes that employ such wireless testing as well as various "on-die" RFID tag antenna designs for facilitating the wireless testing are also described.

27 Claims, 18 Drawing Sheets

U.S. PATENT DOCUMENTS

| | | | |
|---|---|---|---|
| 6,865,701 | B1 | 3/2005 | Youngs et al. |
| 6,888,365 | B2 | 5/2005 | Ma et al. |
| 6,930,499 | B2 | 8/2005 | Van Arendonk et al. |
| 6,962,827 | B1 | 11/2005 | Furue et al. |
| 6,982,190 | B2 | 1/2006 | Roesner |
| 7,023,347 | B2 | 4/2006 | Arneson et al. |
| 7,119,567 | B2 | 10/2006 | Ma et al. |
| 2002/0094596 | A1 | 7/2002 | Higuchi |
| 2002/0094639 | A1 | 7/2002 | Reddy |
| 2002/0125546 | A1 | 9/2002 | Muta |
| 2005/0083203 | A1 | 4/2005 | Surkau |
| 2005/0155213 | A1* | 7/2005 | Eastin .................. 29/593 |
| 2005/0212674 | A1* | 9/2005 | Desmons et al. ......... 340/572.7 |
| 2005/0240369 | A1* | 10/2005 | Diorio et al. ............ 340/572.1 |
| 2005/0241146 | A1* | 11/2005 | Hamburgen ............. 340/572.1 |
| 2006/0038687 | A1* | 2/2006 | White et al. ............ 340/572.8 |
| 2006/0125505 | A1 | 6/2006 | Glidden et al. |
| 2006/0125506 | A1 | 6/2006 | Hara et al. |
| 2006/0125507 | A1 | 6/2006 | Hyde et al. |
| 2006/0145710 | A1* | 7/2006 | Puleston et al. ............ 324/750 |

OTHER PUBLICATIONS

Impinj, Inc., *Self-Adaptive Silicon*, pp. 7, printed Apr. 30, 2004, www.impinj.com/technology/index.php.

Jarwala, N., *Designing Dual Personality IEEE 1149.1 Compliant Multi-Chip Modules*, 1994, IEEE International Test Conference, paper 19.3, pp. 446-455.

Oakland, S., *Considerations for Implementing IEEE 1149.1 on System-on-a-Chip Integrated Circuits*, Test Conference, 2000, Proceedings International, Oct. 3-5, pp. 628-637.

Levitt, M., et al., *Testability, Debuggability, and Manufacturability Features of the UltraSPARCTM-I Microprocessor*, 1995, International Test Conference, paper 6.2, pp. 157-166.

Wood, S., et al., *A 5 GB/s 9-Port Application Specific SRAM with Built-in Self Test*, 1995 International Workshop on Memory Technology, Design and Testing, Aug. 7-8, pp. 68-73.

Yurash, S., et al., *Automatic Test Pattern Generation Comes of Age*, Electronic Engineering, vol. 63, No. 777, Sep. 1991, London GB, pp. 35-36 & 38.

Eichelberger, E.B., et al., *A Logic Design Structure for LSI Testability*, Reprinted from the Proceedings of the 14th Design Automation Conference by the Institute of Electrical and Electroincs Engineers, Inc., pp. 206-212 (1997).

Youngs, L., et al., *Design of the UltraSPARCTM-I Microprocessor for Manufacturing performance, pp. 179-186*, SPIE vol. 2874, Texas Instruments, Inc., Stafford, Texas, USA, assessed Mar. 8, 2004.

Atmel, *IEEE 1149.1-1990 Standard Test Access Port Boundary Scan*, 1900 IEEE Standard 1149.1, pp. 6, Sep. 1999.

John D. Hyde, "Wafer Level Testing for RFID Tags", U.S. Appl. No. 11/014,523, filed Dec. 15, 2004, Final Office Action mailed May 1, 2007. The Final Office Action and a copy of the claims as they were presented to the PTO in response to the Final Office Action.

Dennis Kiyoshi Hara, "RFID Tag With BIST Circuits", U.S. Appl. No. 11/014,076, filed Dec. 15, 2004, Notice of Allowance mailed Jun. 28, 2007. Notice of Allowance, and a copy of the claims as allowed.

Robert M. Glidden, "RFID Tag Design With Circuitry for Wafer Level Testing", U.S. Appl. No. 11/014,075, filed Dec. 15, 2004, Notice of Allowance mailed Aug. 24, 2007. Notice of Allowance, and a copy of the claims as allowed.

Andrew E. Horch, "On Die RFID Tag Antenna", U.S. Appl. No. 11/069,005, filed Feb. 28, 2005, Final Office Action mailed May 9, 2007. The Final Office Action and a copy of the claims as they were presented to the PTO in response to the Final Office Action.

* cited by examiner

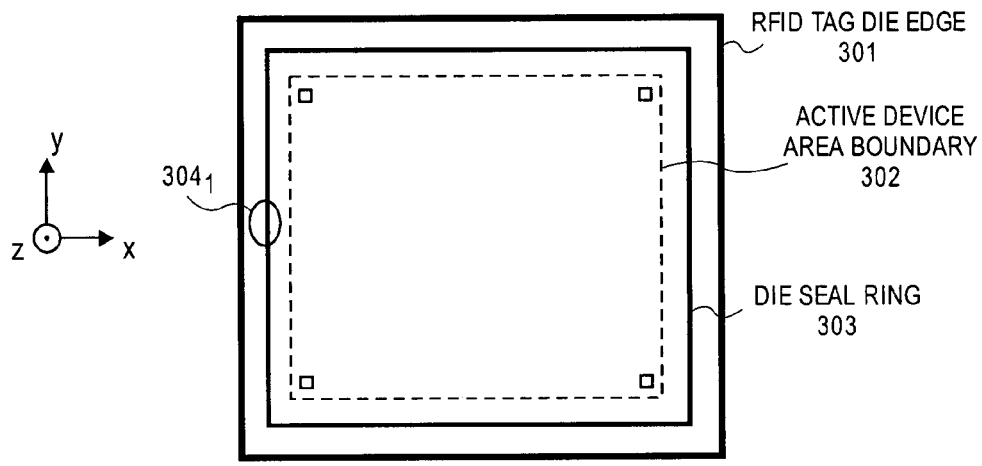
FIG. 3A
(PRIOR ART)
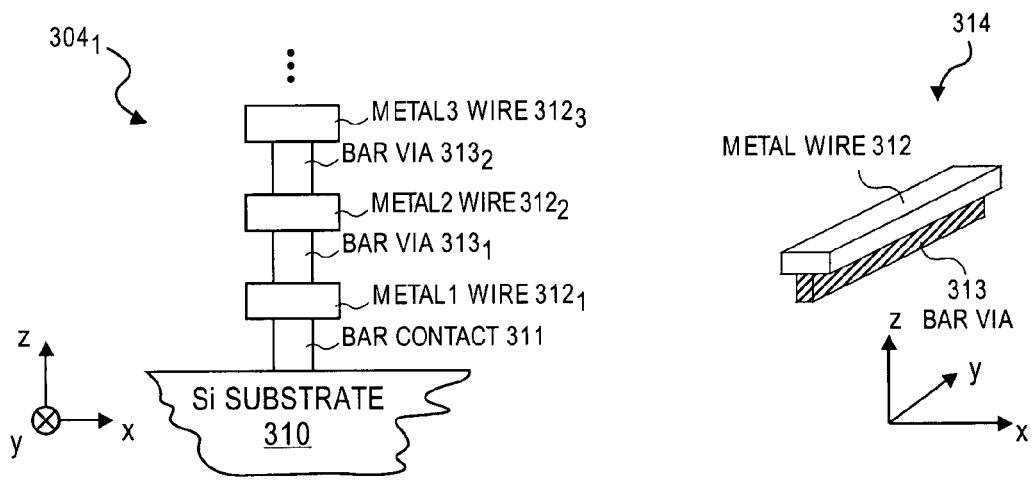
FIG. 3B
(PRIOR ART)
FIG. 3C
(PRIOR ART)

WIRELESS FUNCTIONAL TESTING OF RFID TAG

FIELD OF THE INVENTION

The field of invention relates to the semiconductor chip arts; and, more specifically, to the functional testing of an RFID tag

BACKGROUND OF THE INVENTION

RFID Tags

A Radio Frequency Identification (RFID) tag is a semiconductor chip (also referred to as a "die" or integrated circuit) that can positively respond to a wireless signal sent by a "reader" that inquires into the RFID tag's existence. By positively responding to the reader's wireless signal, the RFID tag can verify its presence to the reader. Frequently cited RFID tag applications include automated inventory management systems and automated transportation/distribution systems (e.g., a pallet affixed with an RFID tag will be able to wirelessly identify itself to an intelligent warehousing reader system so as to confirm its presence within the warehouse).

The less expensive an RFID tag solution, the easier it is to justify the expense of integrating RFID tag semiconductor chips amongst stocked or transported goods. Therefore RFID tag solutions tend to be sensitive to production and/or implementation costs. One aspect that reveals the cost sensitivity of an RFID tag solution is the integration of an RFID tag's antenna.

An RFID tag, being a wireless device, uses an antenna to receive the wireless signal sent by the reader. Generally, the larger an antenna, the more sensitive the antenna is. That is, the larger the antenna, the more apt it is to detect "weak" wireless signals such as those that might be sent by a distant reader. Therefore, in order to increase the communicative range between a reader its corresponding RFID tags, the RFID tags are each affixed with an antenna that is larger than the RFID tag die.

FIG. 1 shows a simple depiction. According to the depiction of FIG. 1, a paper antenna 101 is affixed to an RFID tag 103 with conductive glue 102. The paper antenna 101 is printed upon with conductive ink patterned in some fashion to form a working antenna. Electrical signals induced on the antenna 101 flow through the conductive glue 102 and into the RFID tag die 103. Because a paper antenna 101 is used, the RFID tag die 103 itself does not contain an "on-die" antenna.

The paper antenna 101 dramatically reduces implementation costs while allowing for an antenna size that is significantly larger than the semiconductor die 103 size. In one implementation, the paper antenna 101 is approximately a 10 mm×10 mm square and the die 103 is 1 mm×1 mm square.

Another RFID tag cost structure issue concerns the packaging of the RFID tag die. An appropriate depiction is provided in FIGS. 2a and 2b. RFID tags, being semiconductor chips, are manufactured on wafers where each wafer contains many discrete RFID tag chips. The die 208 from a same sawed wafer are typically separated by channels 210 referred to as "sawed streets", and, a layer of tape 209 beneath the sawed wafer 202 keeps the die 208 in place. A robotic "pick-and-place" machine 201 picks individual die from the sawed wafer 202 (e.g., using a suction cup or collet 207) and places each picked die at a location 203 from where a packaging process may commence. Here, packaging can be any kind of processing that a die is subjected to after it is picked (e.g., integration into a hermetically sealed ceramic "single die" package, placement into a carrier with other die for shipment, etc.).

A typical "pick-and-place" machine generally exhibits movement 204, 205 along at least two planes to "pick-up" the die and move it to another location.

If the RFID tag chips from a same wafer are not sufficiently functionally tested so as to render a "pass" or "fail" disposition until after they have been diced from the wafer and individually packaged, the expense of packaging the portion of chips that ultimately fail their functional test is pure economic waste. Therefore it behooves the RFID tag manufacturer to eliminate this waste through some kind of functional testing that takes place prior to the packaging of the individual die.

Die Seal Rings

A die seal ring is essentially a barrier that surrounds a semiconductor die's active device area in order to block the penetration of contaminants into the die's active device area. The active device area of a die is the region of the die where most if not all of the die's transistors are located. FIGS. 3a through 3c show prior art depictions of a semiconductor die's die seal ring. FIG. 3a shows a top view, FIG. 3b shows a cross-section and FIG. 3c shows a three dimensional perspective of a basic unit of the die seal's structure.

FIG. 3a shows an RFID tag die 301 and its corresponding active device area boundary 302. A die seal ring 303 is observed surrounding the active device area between the active device area boundary and the die edge 303. FIG. 3b shows a cross section of a region $304_1$ of the die seal ring observed in FIG. 3a. According to the depiction of FIG. 3b, the die seal ring is observed to be a stacked structure of metal wires $312_1$, $312_2$, $312_3$, "bar" vias $313_1$, $313_2$ and a "bar" contact 311.

FIG. 3c shows a perspective view 314 of a continuous metal wire 312 and a bar via 313. Whereas a standard via can be viewed as a scalar "dot" of metal that runs through dielectric so as to provide vertical electrical contact between two metal wires that run along different vertical planes, as observed from FIG. 3c, a bar via 313 is "continuous wire-like" and may run the length of the wires its provides electrical contact between. A bar contact 311 is similar to a bar via with the exception that a bar contact provides electrical contact between the semiconductor substrate 310 and a metal wire (whereas a bar via provides electrical contact between vertically separated wires).

From FIGS. 3a through 3c, it is apparent that the die seal ring depicted therein is a type of stacked metal structure that essentially forms a "solid wall of metal" that surrounds the active device area. The solid wall of metal preserves the structural integrity of the active device area's features by preventing external contaminants from reaching the active device area laterally. FIGS. 3a and 3b only show three levels of metal wiring. It should be understood that die seal rings of more or less than three levels of metal wiring can be implemented depending on the type of semiconductor manufacturing process. Typically, a die seal ring will extend through each metal wiring layer used within the RFID tag's active device area.

BRIEF DESCRIPTION OF THE DRAWINGS

The present invention is illustrated by way of example and not limitation in the figures of the accompanying drawings, in which like references indicate similar elements and in which:

FIG. 3a through 3c (prior art) show a die seal ring structure;

DETAILED DESCRIPTION OF THE INVENTION

Recalling from the description in the Background that prior art RFID tags have not been designed with integrated "on die" antenna (because the size of the antenna is not large enough to detect signals from distant readers); and, that functional testing of an RFID tag prior to its packaging would help reduce the manufactured cost of an RFID tag die (because a "bad" die could be identified before expending the cost of its packaging); then, a solution is to design an RFID tag with an integrated "on die" antenna for purposes of functionally testing the die prior to its packaging. Here, an "on-die" antenna is an antenna that is part of the integrated circuitry of the RFID tag formed with the semiconductor manufacturing process used to manufacture the RFID tag itself.

Moreover, certain types of business and/or technology models may involve the shipment of working die that have not been packaged into discrete "per die" packages (e.g., a ceramic casing having leads or other type of electrical "I/O"). Here, the ability to screen functional vs. non-functional individual, unpackaged die is important because such screening could be used to prevent the shipment of non-working die. Moreover, certain types of business models may not require the use of a paper antenna. That is, only "short range" listening capability is required between the RFID tag and the reader, and, an on-die antenna has sufficient range to meet the desired performance objectives. RFID tags chosen for such applications should be functionally testable without application of an external antenna.

Figure 1:
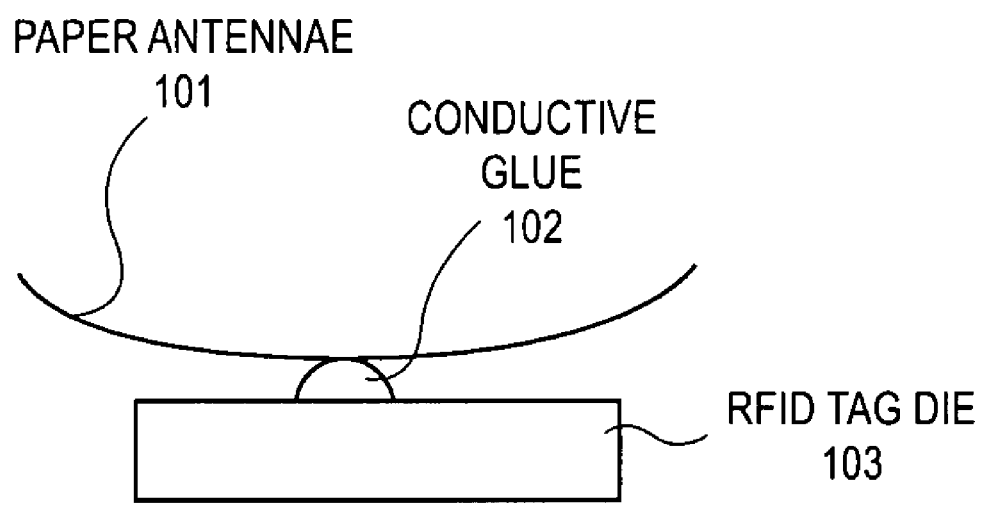
FIG. 1 (prior art) shows a paper antenna attached to an RFID tag.
Figure 2A:
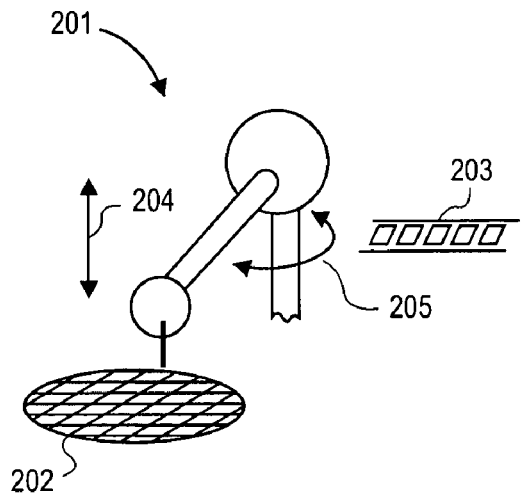
FIGS. 2a and 2b (prior art) shows a pick-and-place machine.
Figure 2B:
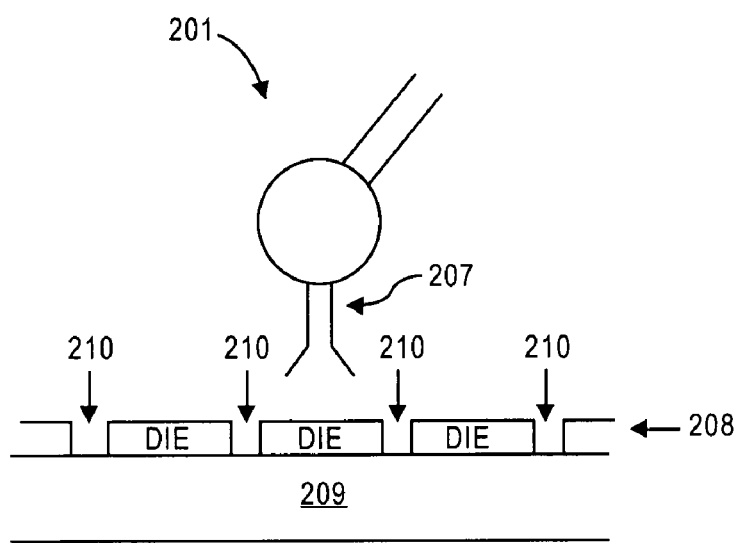
Figure 4A:
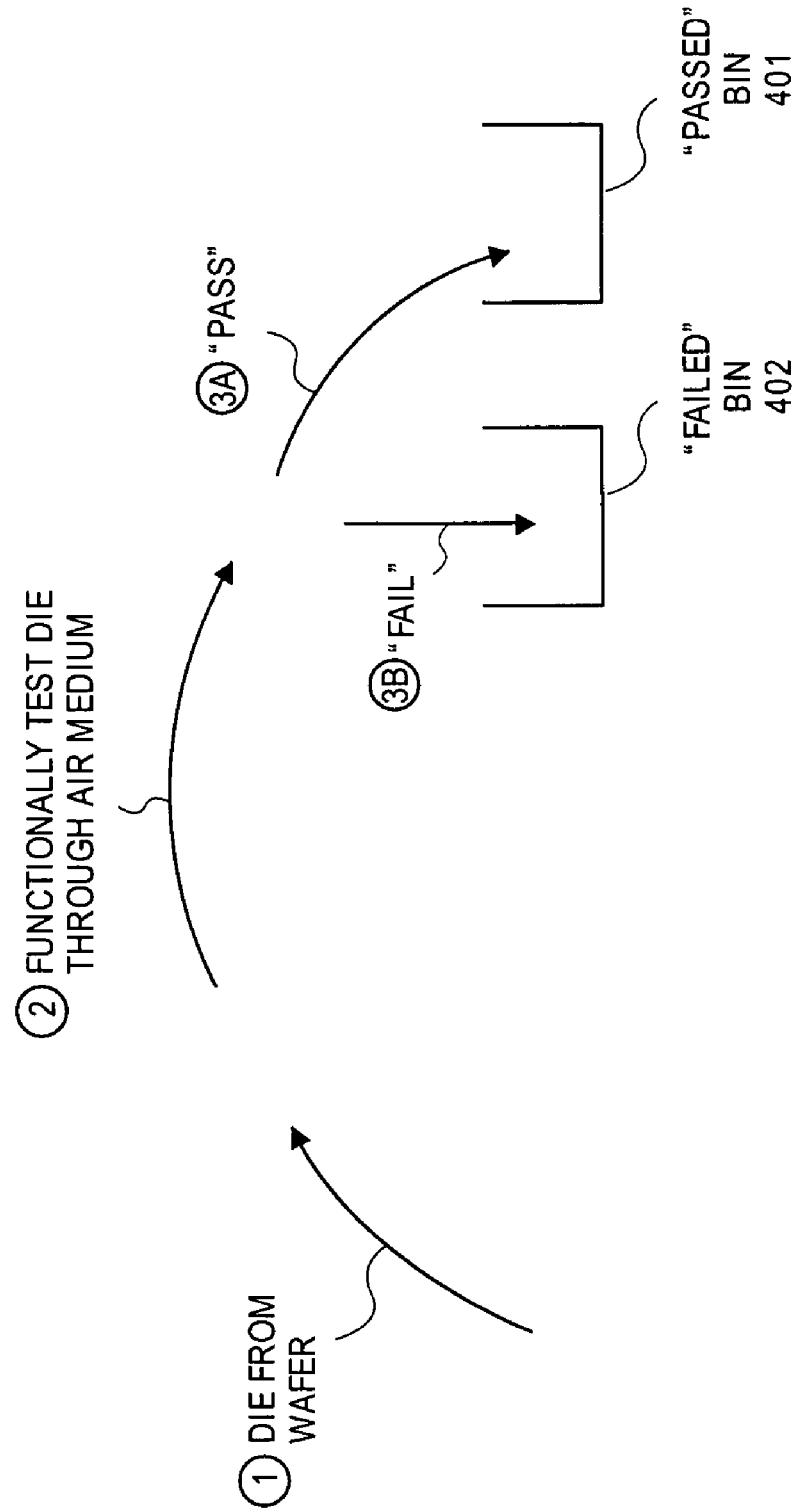
FIG. 4a shows an embodiment of a methodology in which an RFID tag having an "on-die" antenna is functionally tested in wireless fashion over the course of its transport between different locations.
Figure 4B:
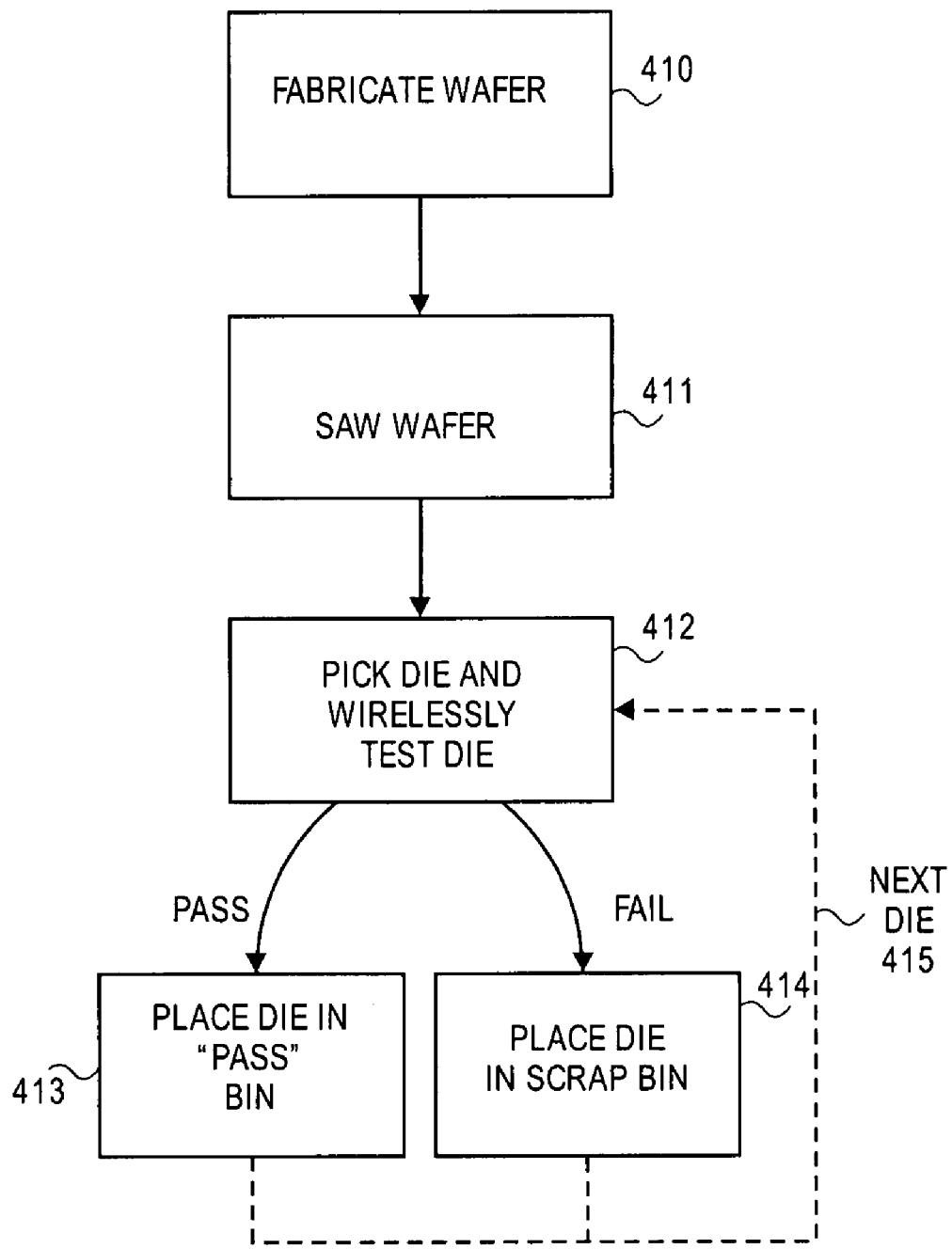
FIG. 4b shows a flow diagram that corresponds at least to the embodiment of FIG. 4.

FIGS. 4a and 4b show, at a high level, the wireless testing of an individual RFID tag (i.e., the testing of an RFID tag where one or more test signals are sent through an air-medium) so that a functional disposition can be made on the RFID tag (e.g., "pass" or "fail"). Here, an individual RFID tag is grasped 1 and functionally tested 2 through an air medium. If the RFID tag passes the functional testing 3a it is placed in a "pass" bin 401. If the RFID tag fails the functional testing 3b it is placed in a fail bin 402. By treating RFID tags placed in the "pass" bin 401 as having successfully yielded their manufacturing process (e.g., through shipment and/or packaging), and, by treating RFID tags placed in the "fail" bin 402 as having not successfully yielded their manufacturing process, certain economic wastes can be avoided.

Figure 4C:
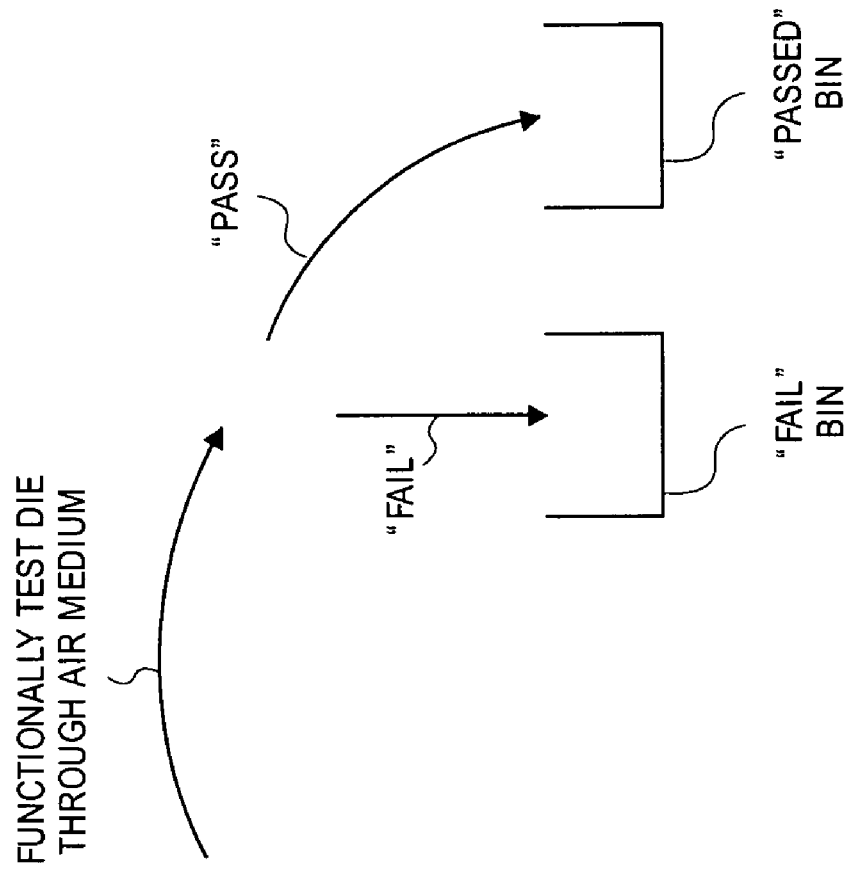
FIG. 4c shows an embodiment of a methodology in which an RFID tag having an "on-die" antenna is functionally tested in wireless fashion during pick-and-placement.
Figure 4C:
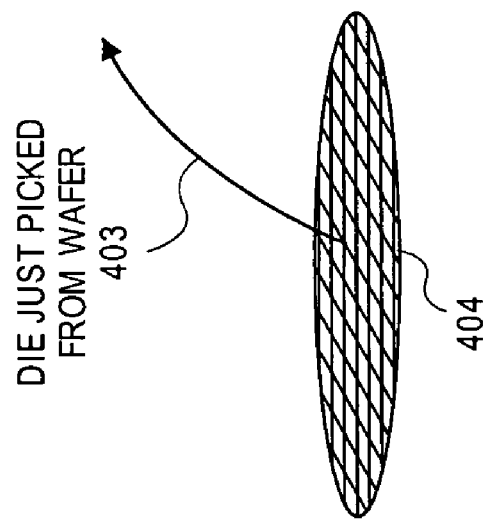

In order to test an individual RFID tag, the RFID tag should be separated from the other die manufactured on the same wafer as the RFID tag. FIGS. 4b and 4c describe not only the wireless testing of an individual RFID tag prior to any treatment based on its functional disposition, but also, separation of the die from its corresponding wafer beforehand. According to FIG. 4b a wafer is initially fabricated 410, and, after its fabrication, the wafer is sawed 411.

Then, referring to FIGS. 4b and 4c, an individual RFID tag is picked 403 (e.g., from the sawed wafer 404 itself) and wirelessly tested 412. If the RFID tag passes its functional testing is placed in a "pass" bin 413. If the RFID tag fails its functional testing, the RFID is placed in a "fail" bin 414. The process repeats for each die from the wafer 415. Again, die placed in the pass bin can be given further appropriate treatment (e.g., direct shipment, packaging, etc.). RFID tags placed in the "fail" bin are effectively prevented/screened from being given such treatment and, according to at least one approach, are discarded.

Figure 4D:
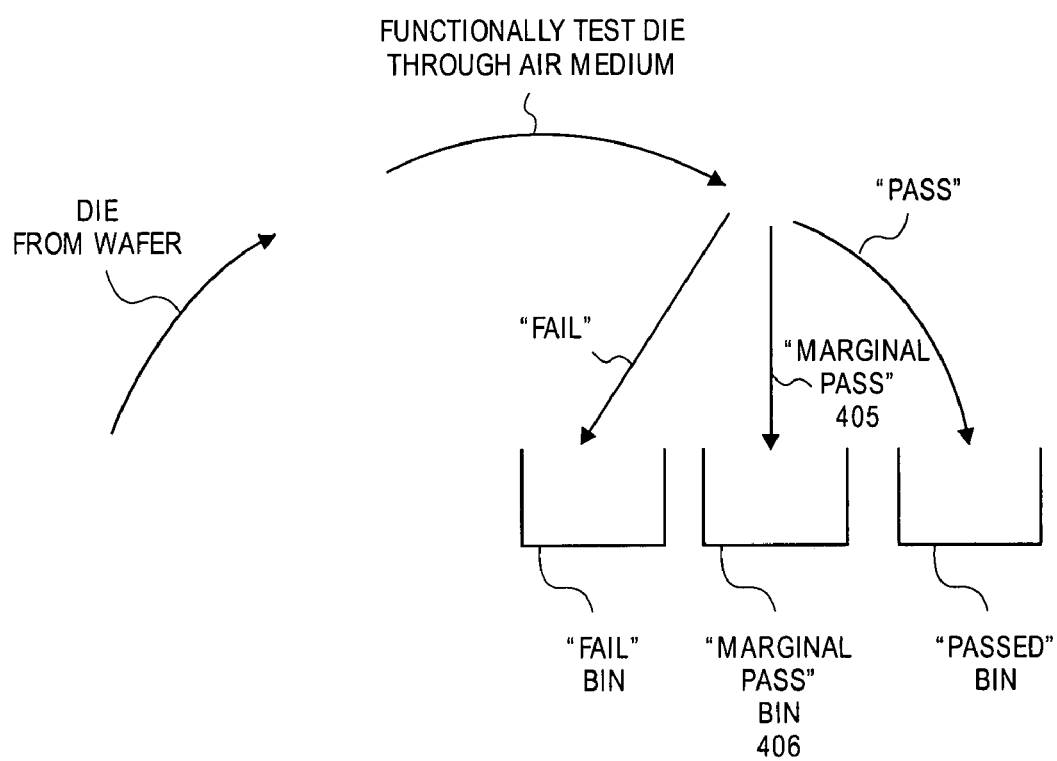
FIG. 4d shows an extension of the methodology of FIG. 4c in which a tested RFID tag may be placed in a passed bin, a failed bin or a marginally passed bin.

FIG. 4d shows an extension to the approach of FIG. 4a in which the functional test disposition has three possible outcomes: "pass", "fail", and "marginal pass". Here, a marginal pass 405 could be given to an individual die having one or more tested characteristics that fall outside a specified "passing" range. A marginally passing RFID tag is placed in a "marginal pass" bin 406 from where some kind of treatment, other than being immediately scrapped (e.g., as in the case of a "fail") and other than being unconditionally sent forward (e.g., as in the case of a "pass") is applied.

For example, RFID tags submitted to the "marginal pass" bin 406 may be identified as being suitable only for a limited number of applications (e.g., low performance applications where the reader is specified to exhibit a strong output signal and/or is specified to be placed close to the RFID tag) whereas RFID tags submitted to the "pass" bin have no restrictions placed as to which application they may be placed in. Essentially, where more than two test results are possible the manufacturer has the ability to grade yielded die (e.g., A, B, C, etc.), where, typically, more restrictions are placed on the usage of die given a lower grade than die receiving a higher grade.

Figure 4E:
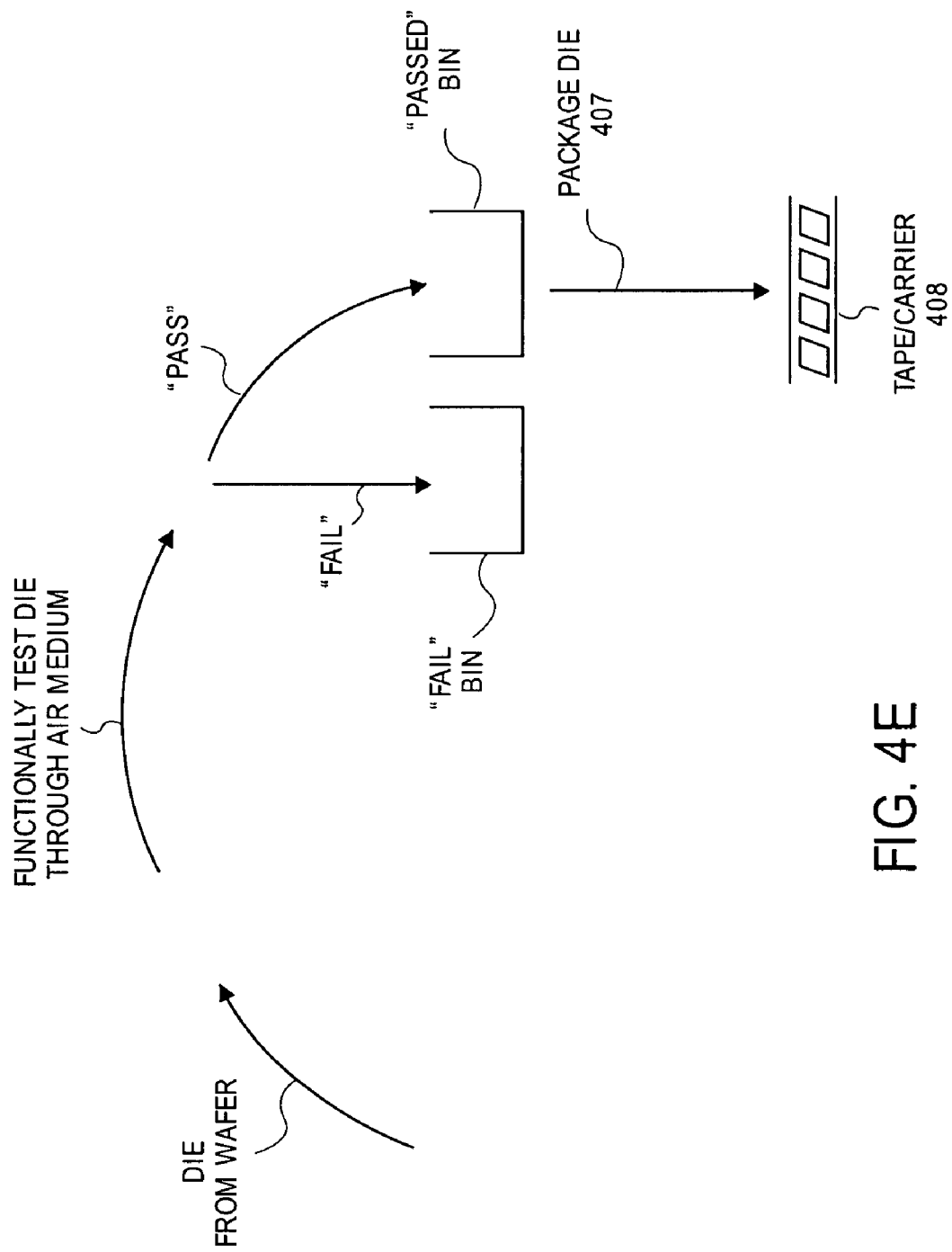
FIG. 4e shows an extension of the methodology of FIG. 4c in which a tested RFID tag that has passed its functional testing is moved from a passed bin to a carrier from where packaging of the RFID tag may commence.

FIG. 4e shows an extension of the approach of FIG. 4a in which RFID tags deemed to be "passing" are sent forward to a packaging process 407. The commencement of the packaging process 407 may involve placement of the RFID tag on a run of tape or on a die carrier 408. In a further approach, "passing" RFID tags are placed directly in a location from where the packaging process 407 may commence (e.g., by being placed directly on the tape/carrier 408 by a pick-and-place machine that transports the die while it is being functionally tested).

Figure 4F:
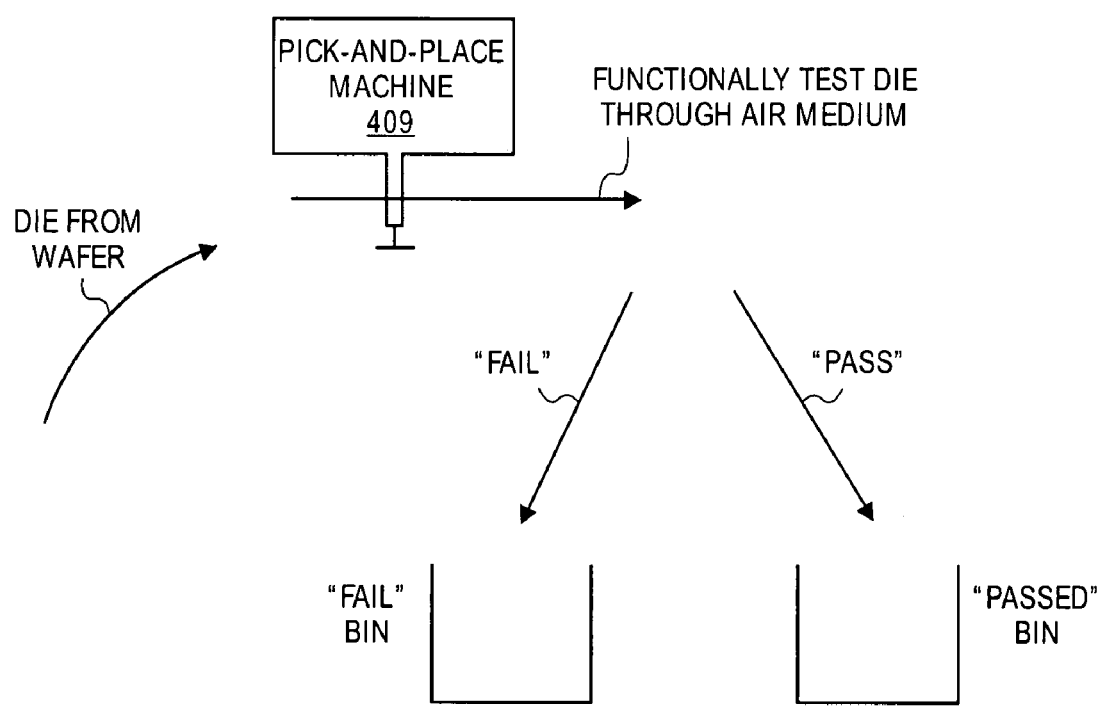
FIG. 4f shows an extension of the methodology of FIG. 4c in which a pick-and-place machine is shown.

FIG. 4f shows an implementation where the RFID tag is physically in the grasp of a pick-and-place machine 409 while the RFID tag is being functionally tested through an air medium. Here, it should be understood that the approach of FIG. 4f may be performed in conjunction with any one or more of FIGS. 4a through 4e. That is, the functional test may occur while an RFID tag is being transported (i.e., travels along some kind of trajectory (where a trajectory is understood to mean a "path" that is linear, curved and/or otherwise)) to a location by a pick-and-place machine 409. According to a further approach, the pick-and-place machine 409 picks an RFID tag from amongst die manufactured on the same wafer (e.g., the pick-and-place machine 409 picks the RFID tag from a sawed wafer) and wirelessly tests the die before a decision is made as to where the RFID tag is to be placed based upon the results of the functional testing (e.g., pass bin, fail bin, marginal pass bin, tape/carrier, start of packaging process, etc.).

Figure 4G:
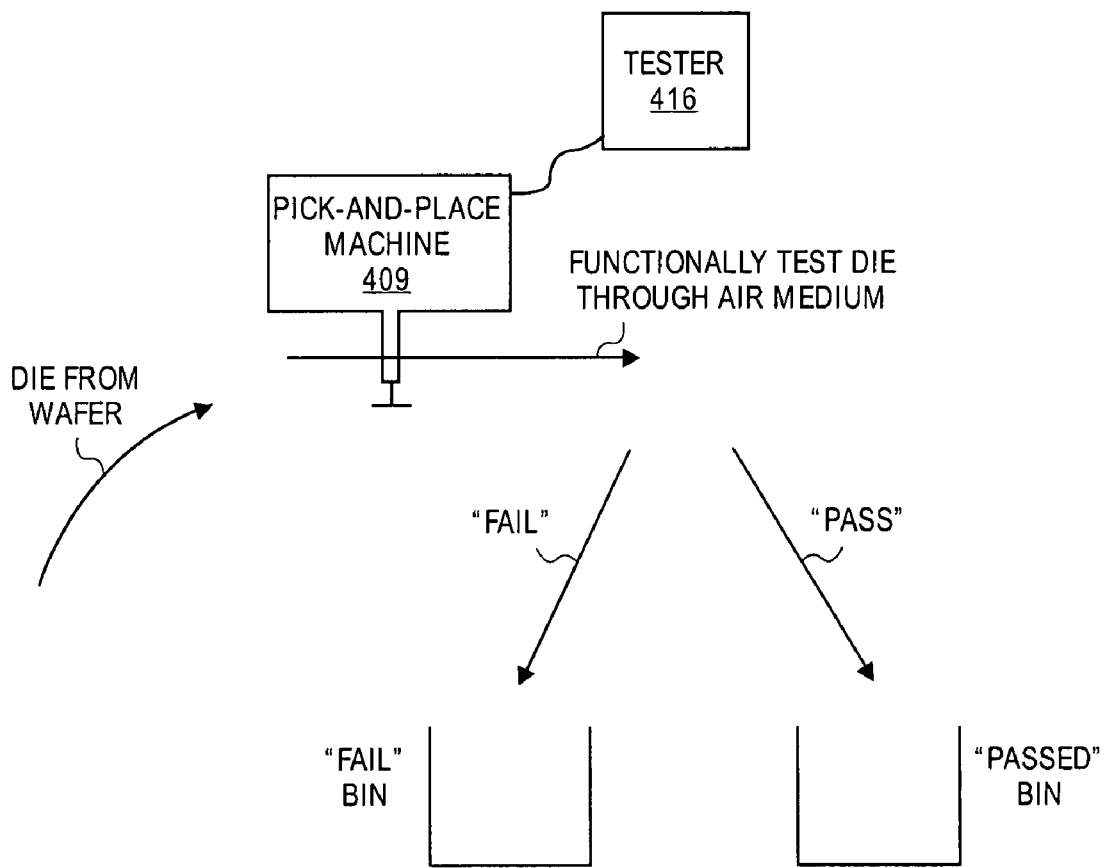
FIG. 4g shows an extension of the methodology of FIG. 4f in which a tester is shown being integrated with the pick-and-place machine.
Figure 4H:
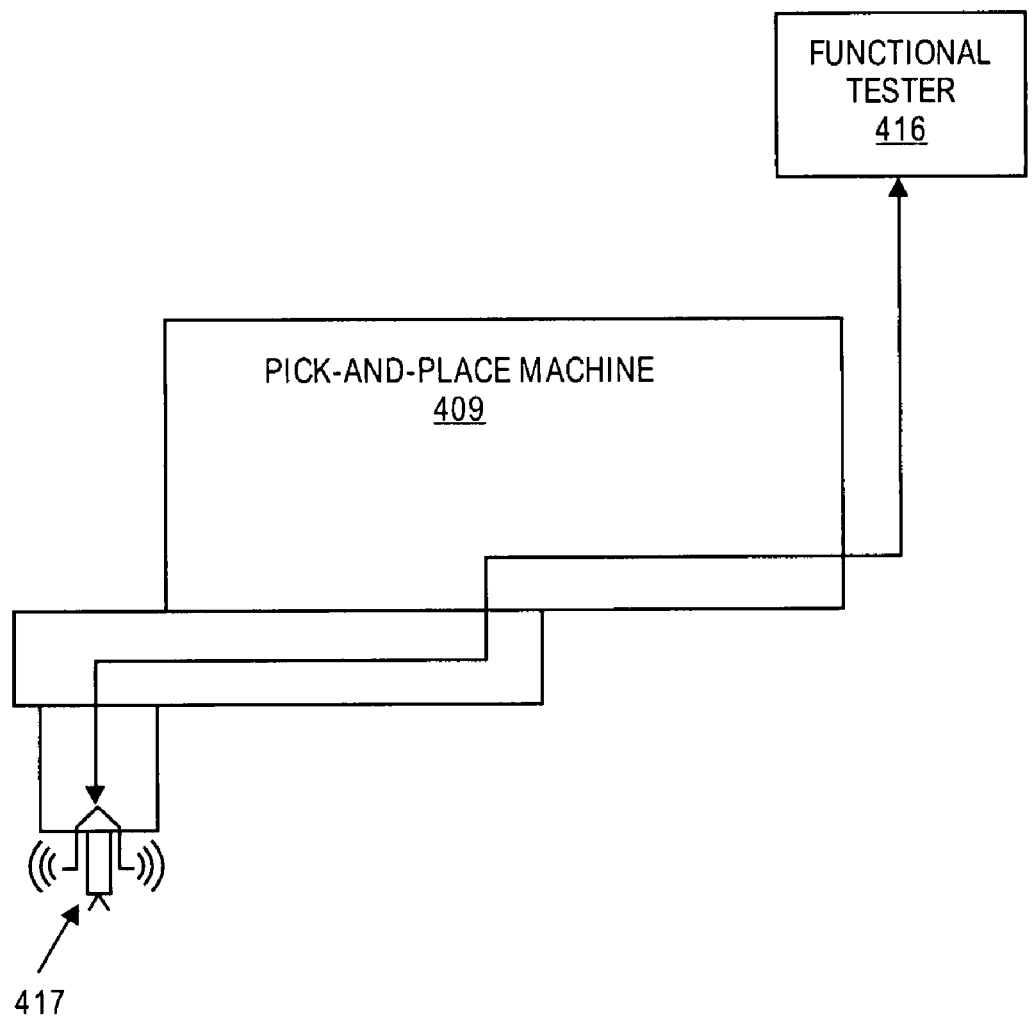
FIG. 4h shows a depiction of a functional tester's antenna being coupled to a pick-and-place machine.

FIG. 4g shows the coupling of a functional tester 416 to a pick-and-place machine 409 in order to effect wireless functional testing. FIG. 4h shows that the antenna 417 used for wirelessly testing an RFID tag that is in the grasp of the pick-and-place machine 409 may be physically coupled to the pick-and-place machine 409.

According to one embodiment, a picked die is deliberately tested at a location where the remaining non picked die manufactured from the same wafer 302 cannot suitably detect the wireless signals from the functional test equipment. Here, manufactured RFID tag die may contain hardwired "initial" identification codes that repeat over the surface of the wafer (e.g., every reticle). As such, if any of the yet-to-picked die could detect the wireless signaling from the functional test equipment, multiple die that respond to the same identification code might simultaneously respond to a functional test intended to be administered to a single die having the identification code.

Moreover, an RFID tag is typically designed to convert energy from a received wireless signal into the electrical power that drives the RFID tag's transistors. Here, if the yet-to-picked die from a same wafer were to detect the functional tester's wireless signal, and if such die were not yet separated from one another (e.g., their region of the wafer had not yet been sawed), it could result in the "power-up" of a large number of these die.

Figure 5:
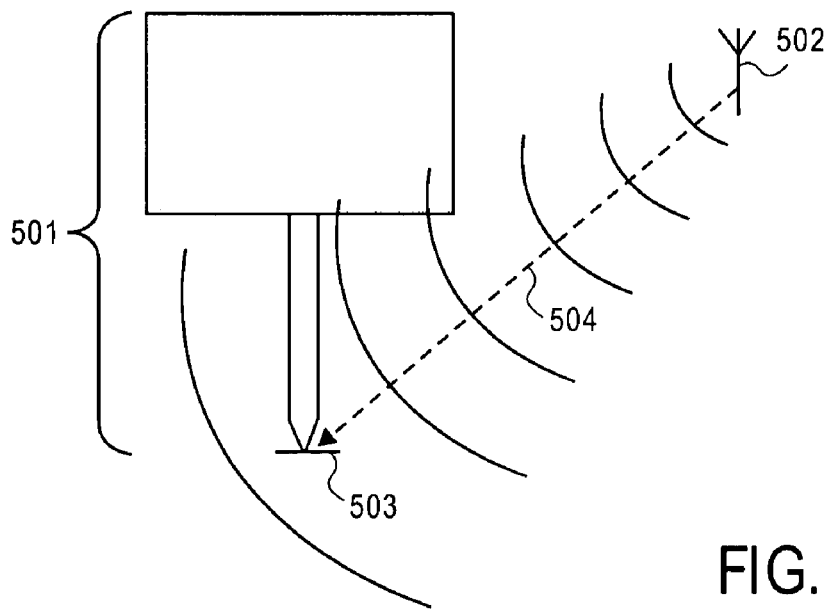
FIG. 5 shows a depiction of an RFID tag in the grasp of a machine being tested through an air medium.

FIG. 5 shows an implementation where the transmitting antenna 502 for the functional tester (which may or may not be affixed to the pick-and-place machine 501) being located a small distance 504 from a die 503 that is in the grasp of the pick-and-place machine 501. Here, over the time period in which a picked die is functionally tested: 1) the transmitted power of the wireless signal from the functional tester antenna 502 should be small enough; 2) the distance 504 between the functional tester antenna 502 and the die 503 under test should be small enough; 3) and the distance between the functional tester antenna 502 and the yet-to-be-picked die (not shown) should be large enough—such that—the die 503 under test detects the functional tester's wireless signal but each die yet-to-be-picked does not detect the functional tester's wireless signal.

Recalling from the discussion in the Background that smaller antenna size results in lower antenna sensitivity, note that an on-die antenna will have less sensitivity than a larger paper antenna (because of the small size of the RFID tag die); which, in turn, results in the above described implementation goals being achievable. Specifically, owing to the lower sensitivity on-die antenna, the yet-to-be-picked die will not be able to detect the functional tester's wireless signal—particularly if the die under test 503 is located at the time of its testing close to the functional tester antenna 502 and the wireless signal emanating from the functional tester antenna 502 is of a sufficiently low power. The functional tester antenna 502 may be affixed to (or otherwise integrated with) the pick-and-place machine; or, may simply be placed proximate to the pick-and-place machine.

Figure 6:
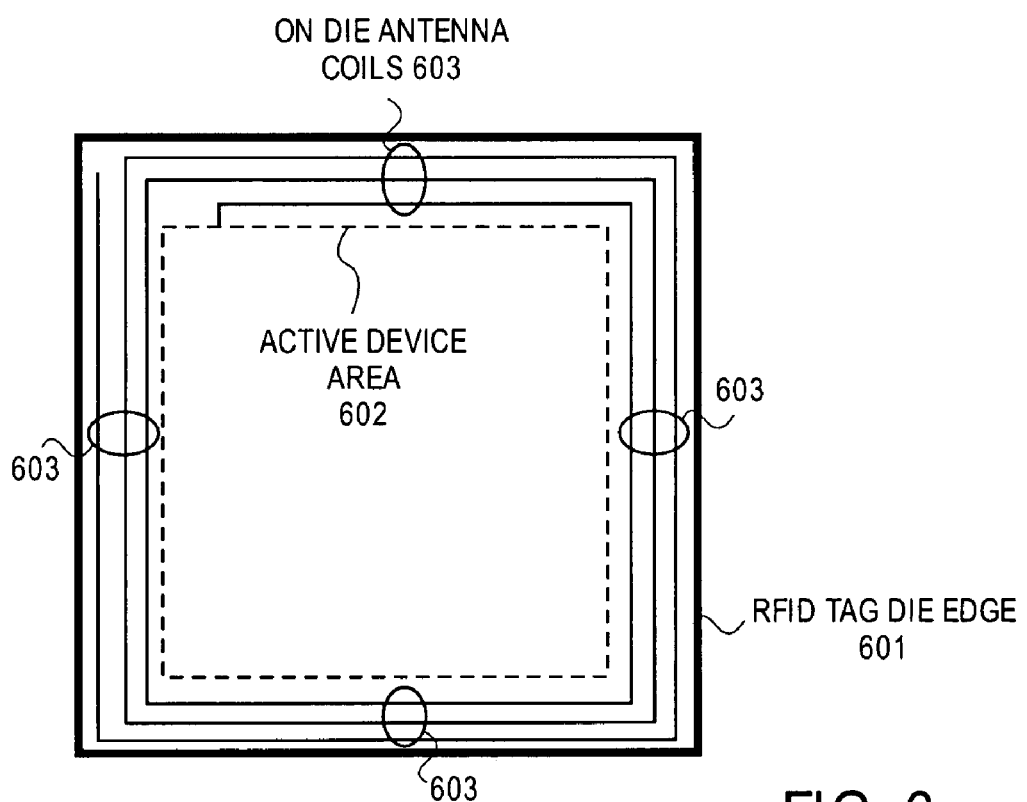
FIG. 6 a top view of an RFID tag having an on-die antenna.

FIG. 6 shows a high level depiction of an RFID tag die 601 having an integrated on-die antenna 603 that is placed outside the RFID tag's active device area 602. Placement of the antenna 603 outside the active device area 602 allows for simpler design (because the antenna wiring is essentially separated from the wiring of the RFID tag's primary components); and, moreover, yields an antenna having sufficient size to be sensitive to the functional tester's wireless signal. Also, placement of the "on-die" antenna outside the RFID tag's die-seal ring prevents the die-seal ring from shielding the antenna from the wireless signal it is supposed to receive.

Figure 7:
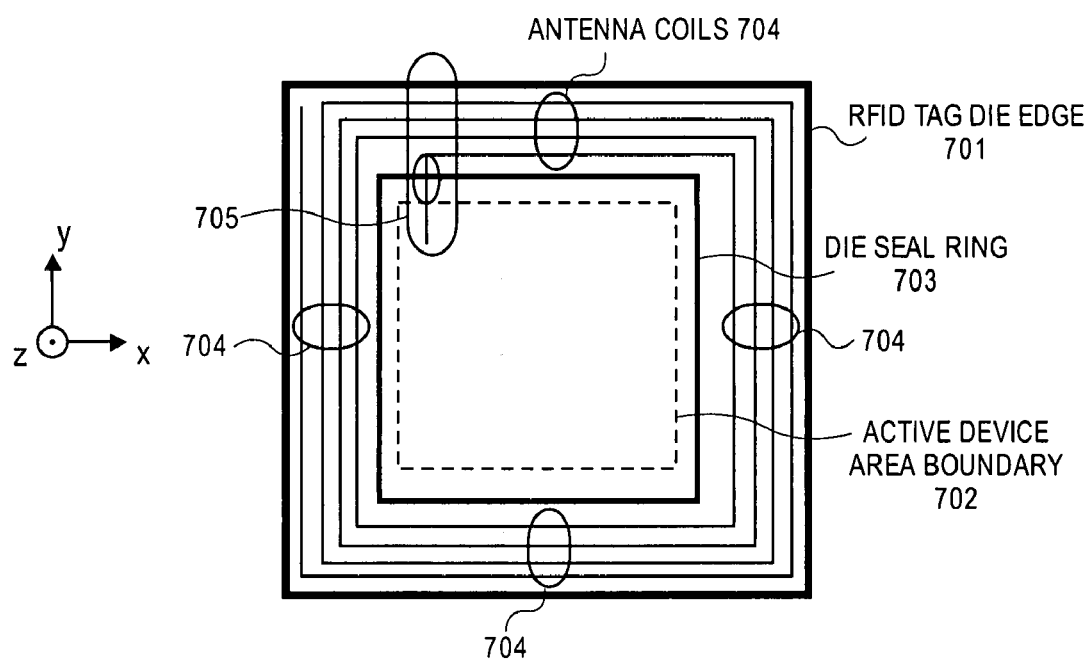
FIG. 7 shows a top view of an RFID tag having an on-die antenna that is electrically isolated from the RFID tag's die seal ring.
Figure 8A:
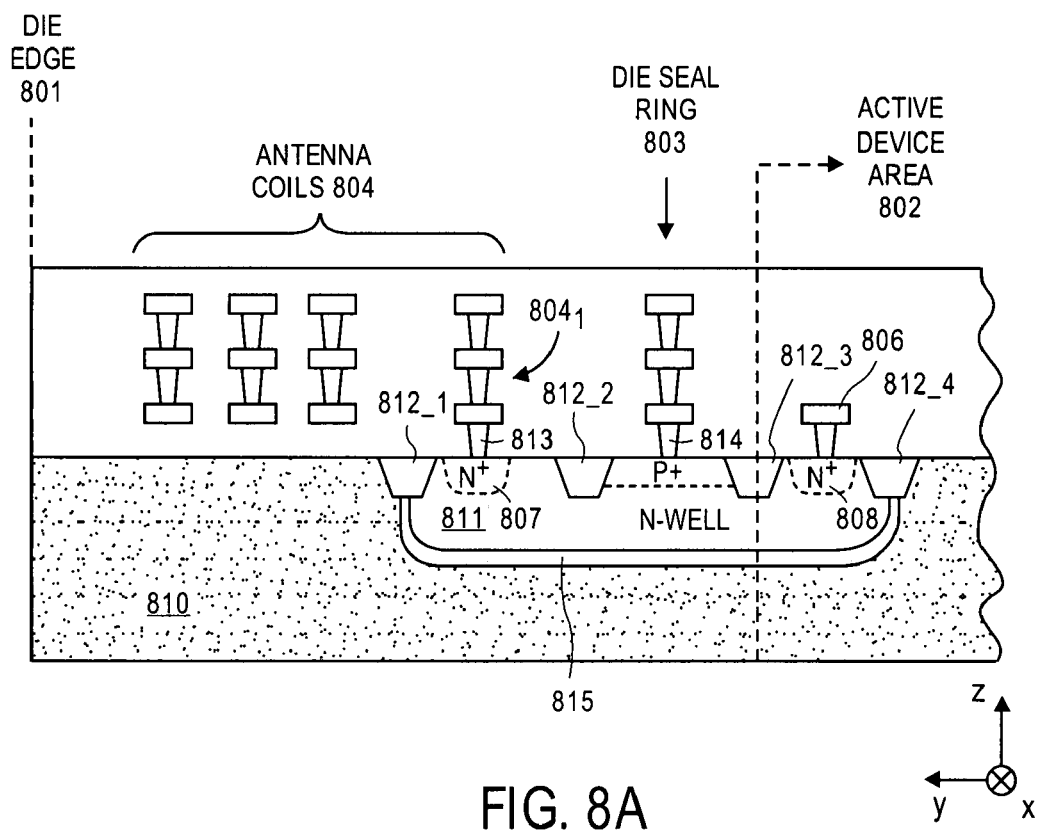
FIG. 8a shows a first embodiment of a cross section of a region of FIG. 7 where electrical contact between the on-die antenna and the active device area is made.
Figure 8B:
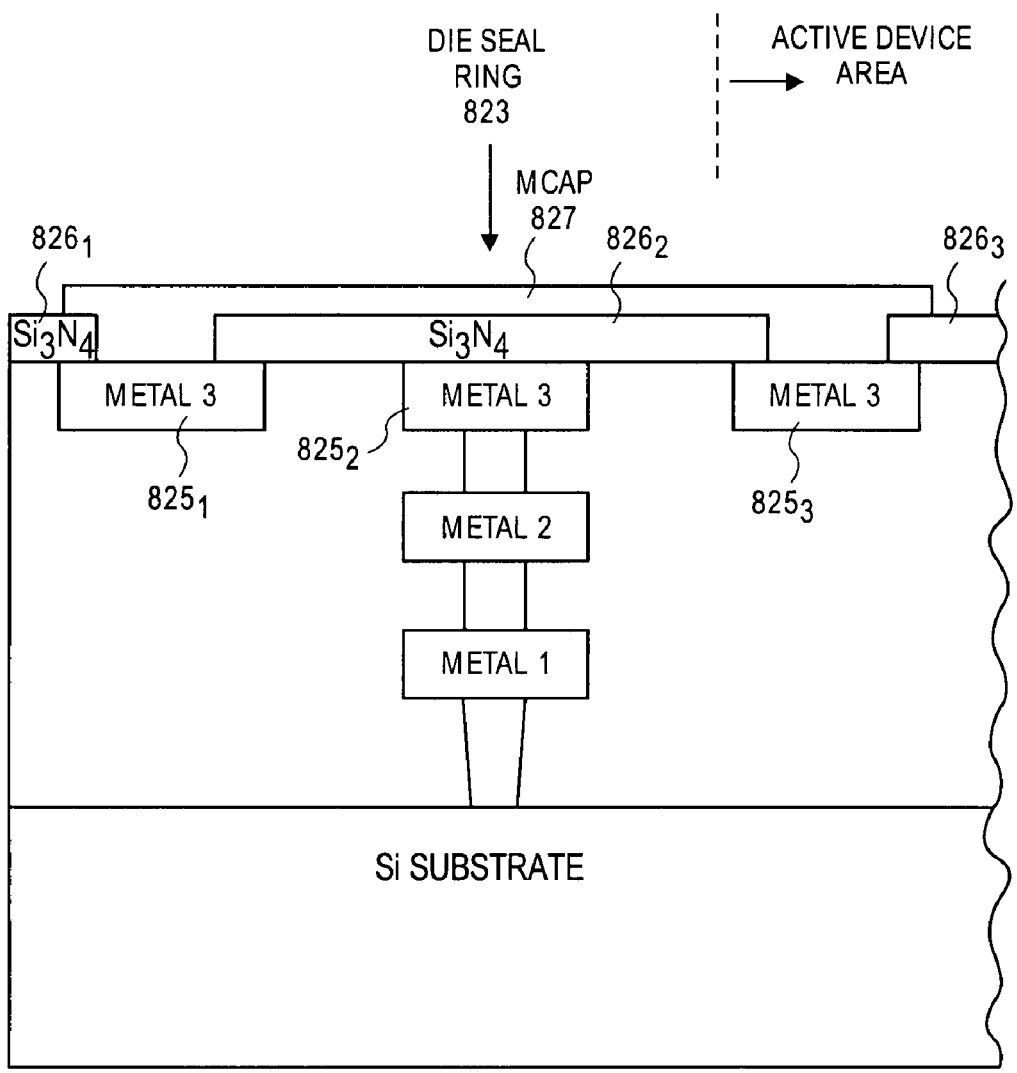
FIG. 8b shows a second embodiment for making electrical contact between the on-die antenna and the active device area.
Figure 9:
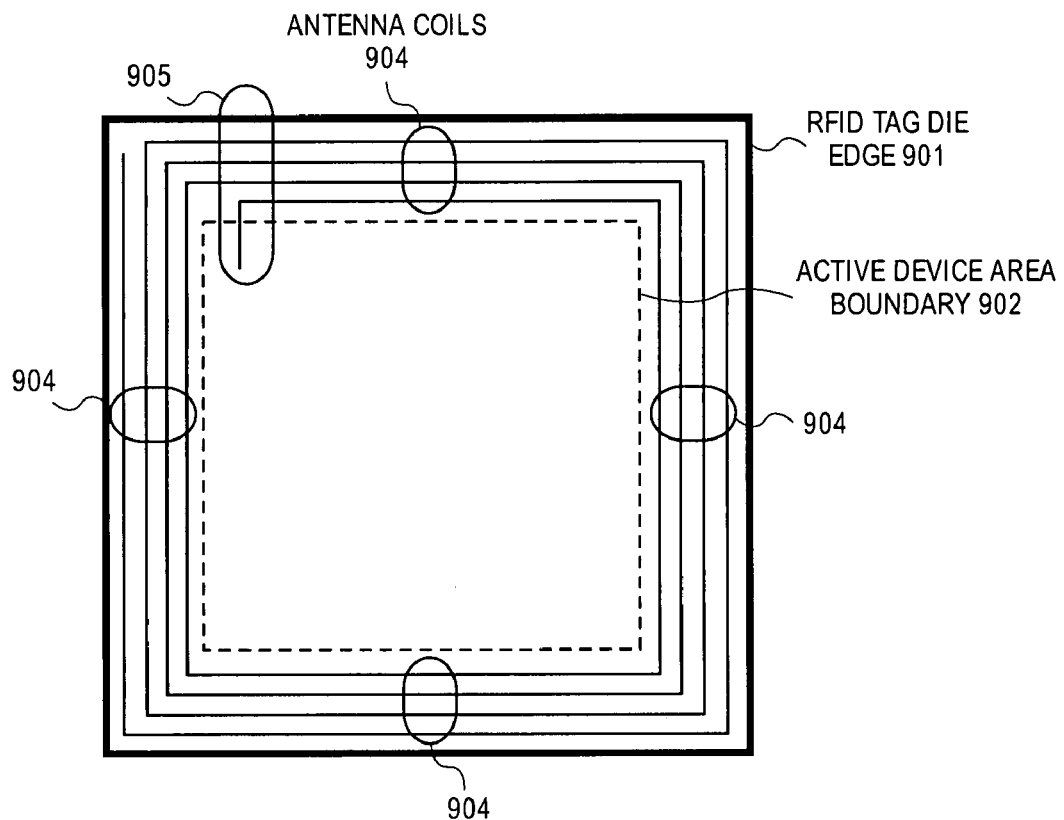
FIG. 9 shows a top view of an RFID tag having an on-die antenna that is electrically integrated with an effective RFID tag die seal ring structure.
Figure 10:
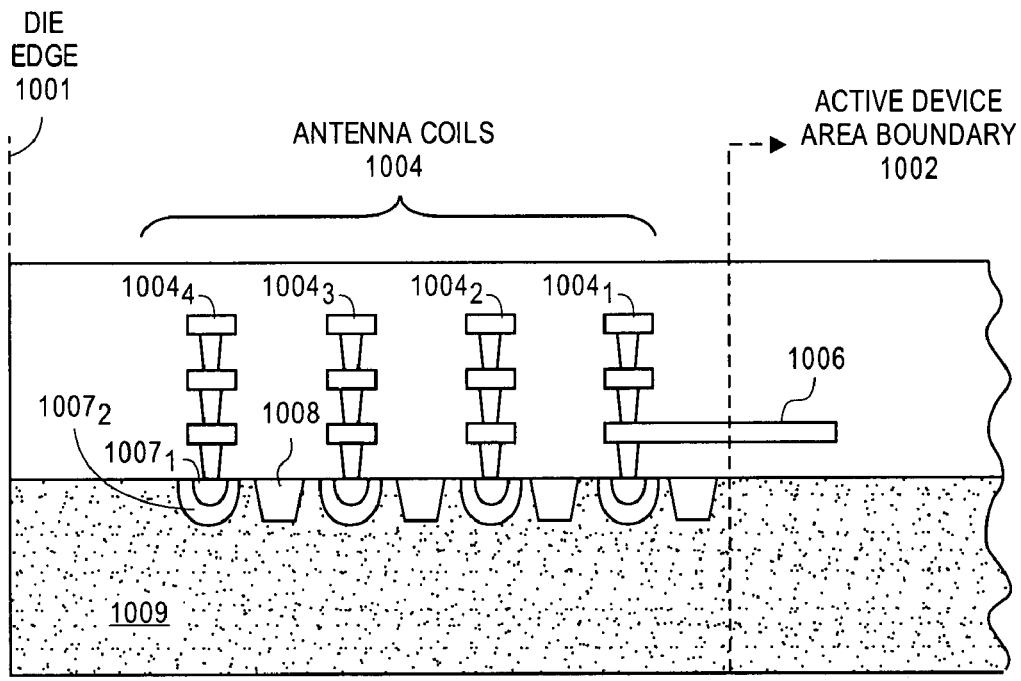
FIG. 10 shows a cross section of a region of FIG. 9.
Figure 11:
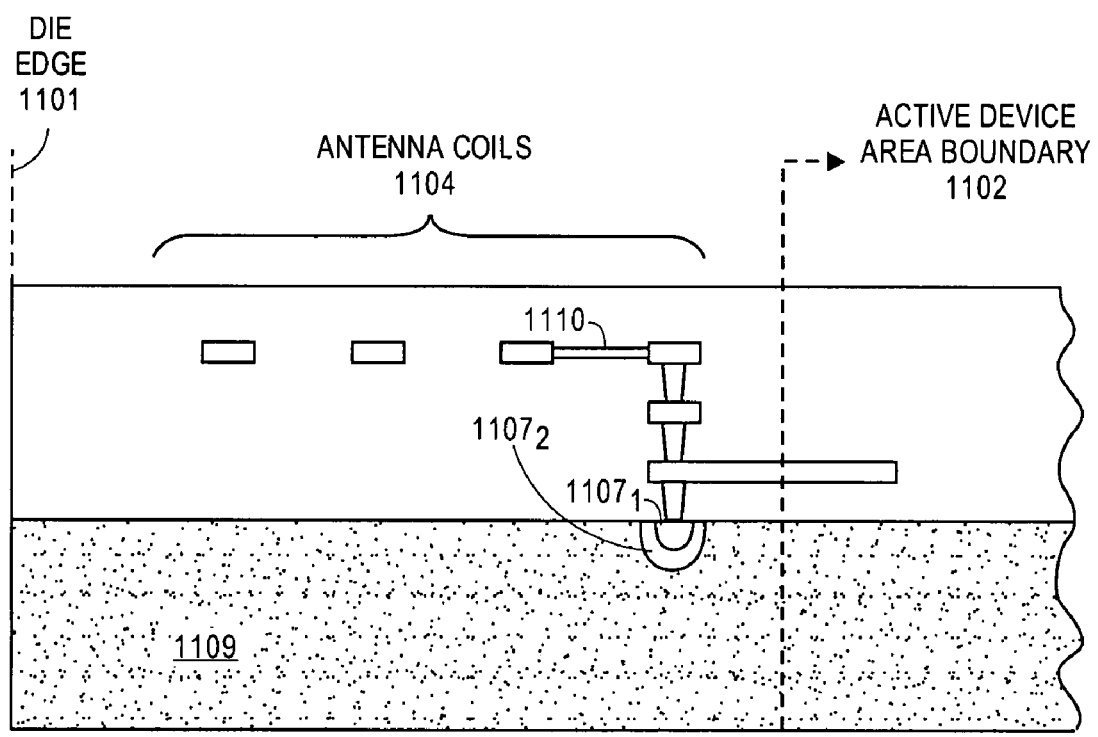
FIG. 11 shows a cross section of a region of FIG. 9.
Figure 12:
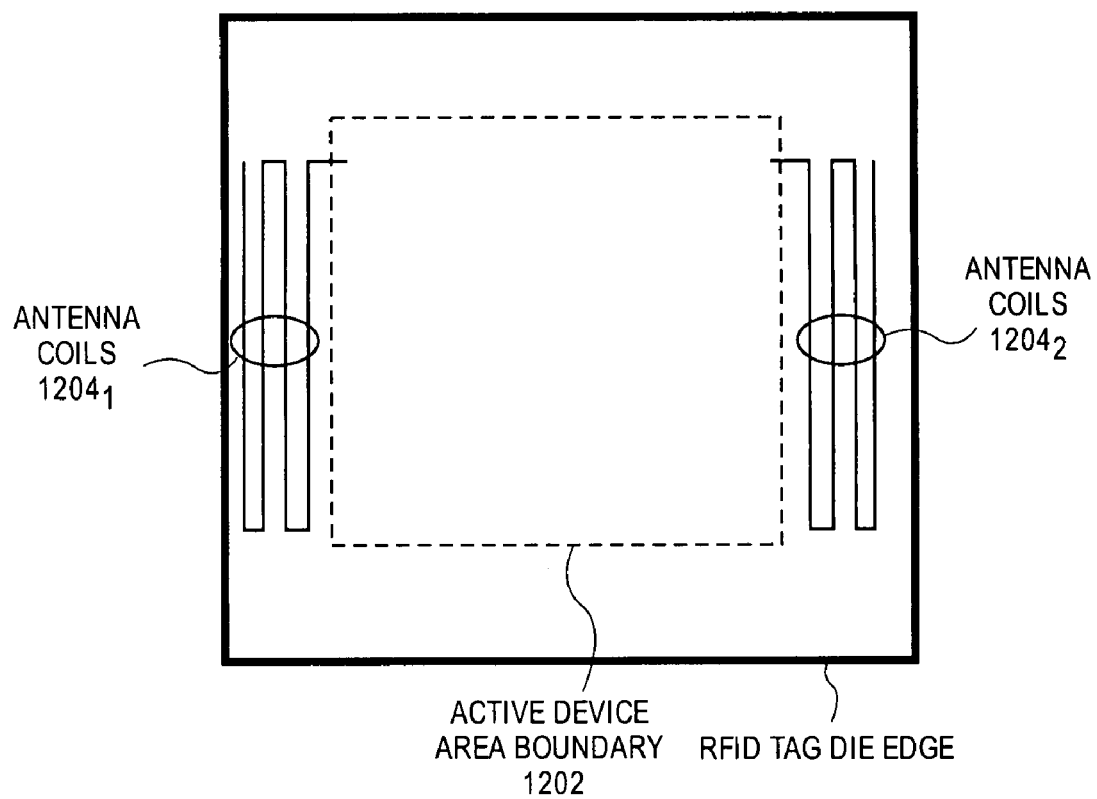
FIG. 12 shows a dipole on die RFID tag antenna.

Possible RFID tag "on-die" antenna designs are discussed immediately below with respect to FIGS. 7 through 11. Recall from the background section the discussion concerning RFID tag die seal rings. FIGS. 7 and 8a, 8b depict design embodiments where the on-die antenna is electrically isolated from the die's die seal ring. By contrast, FIGS. 9, 10 and 11 depict design embodiments where the on-die antenna is structurally and electrically integrated with the RFID tag's die seal ring. The die seal ring of the embodiments depicted in FIGS. 7 and 11 can be implemented as a traditional die seal ring. By contrast the die seal ring of the embodiments depicted in FIGS. 9 and 10 are non traditional in the sense that the die seal ring "loops around" the active device area (to construct an antenna). An additional on-die antenna design embodiment is depicted in FIG. 12.

FIG. 7 shows an integrated on die antenna 704 whose corresponding wiring runs substantially outside the die seal ring 703 of an RFID tag die 701. As discussed in the Background, the die's deal seal ring 703 surrounds the die's active area 702. The antenna wiring 704 is depicted as a coil that spirals around the die's die seal ring 703. Spiraling a continuous length of wiring multiple times around the die's die seal ring 703 corresponds to an extended antenna wire length. Here, the longer the antenna wire length the greater the sensitivity of the antenna.

Recalling the discussion above concerning the sensitivity of the integrated on-die antenna, an antenna of appropriate sensitivity for a particular application can be particularly designed for by coiling the antenna wire for an appropriate number of turns. In one embodiment, the antenna wire length runs for approximately four full turns around the active device area of a 1 mm×1 mm die (i.e., approximately 16 die edge lengths=16 mm wire length).

According to the design implementation of FIG. 7, the antenna wiring 704 is isolated from the die's die seal ring 703. A first embodiment of the cross section of region 705 of FIG. 7 is shown in FIG. 8a to demonstrate not only an exemplary cross section of the antenna wire coils 704, 804 but also a design for making electrical contact between the antenna wiring 704, 804 and a node within the active device area 702, 802, where, again, the die's die seal ring 703, 803 surrounds the active device area 702, 802 and is electrically isolated from the antenna wiring 704, 804.

According to the depiction of FIG. 8$a$, each of the antenna coils 804 are constructed similarly to the die seal ring 803. That is, essentially, a solid wall of metal formed with metal lines, bar vias and bar contacts. In a sense, the cross section "looks like" multiple die seal rings. The innermost antenna coil 804$_1$ from the die edge 801 (i.e., the antenna coil 804$_1$ closest to the die seal ring 803) is electrically coupled to a metal wire 806 within the active area 802 through a conductive channel that includes regions 807, 808 doped similarly to source/drain regions and a well 811 that is formed within the semiconductor substrate 810.

According to the specific implementation observed in FIG. 8$a$, an N doped well 811 formed within a substrate 810 is part of the conductive channel. The conductive channel also includes N+ doped regions 807, 808 beneath the contact metal 813 of antenna coil 804$_1$ and active region wire 806, respectively. The conductive channel is isolated from the die seal 803 by way of a P+ doped region between the N well 811 and the die seal contact metal 814. The P+ region corresponds to the anode of a reverse biased diode that essentially forms the electrical isolation between the conductive channel 811 and the die seal ring 803. Trench isolation regions 812$_1$ through 812$_4$ are part of the exemplary applicable semiconductor process and help thwart lateral current flow near the semiconductor substrate surface.

FIG. 8$a$ also shows a layer 815 between the embedded conductive channel layer 811 and the bulk substrate 810. Here, the presence of layer 815 forms a pair of PN junctions (one at the layer 811/layer 815 interface and one at the layer 815/layer 810 interface). The pair of PN junctions essentially forms a vertical bipolar transistor whose base (layer 815) is "open circuited" so that the transistor is permanently "off" so as to prevent current flow in either direction between the conductive channel 811 and the bulk substrate 810. Here, if bulk substrate region 810 were doped N type, layer 815 would be doped P type and well 811 would be doped N type as depicted in FIG. 8$a$. Conversely, if substrate region 810 were doped P type, layer 815 would be N type, the well 811 conductive channel would be doped P type and regions 807 and 808 would be degenerately doped P type (i.e., P+). In order to properly form the reverse biased diode between the N well 811 and the die seal ring (i.e., the P+ region of FIG. 8$a$) would be replaced by a P+/N region so that a vertical P+/N/P structure exists (where the P region is well 811). More details regarding isolation between the antenna node and the substrate are provided with respect to FIGS. 10 and 11.

FIG. 8$b$ shows another approach that is compatible at least with Copper (Cu) metallurgy based manufacturing processes (i.e., manufacturing processes where the interconnect wiring is formed substantially with Cu). In Cu based processes (and possibly other Damascene processes) a conductive "capping" layer is formed over the highest layer of Cu based wiring in order to prevent the corrosion of the Cu based wiring. The capping layer is typically made of a non corrosive metal such as Aluminum (Al). Thus, referring to FIG. 8$b$, metal wires 825$_1$ through 825$_3$ correspond to the highest layer of wiring based on Cu.

The capping layer is shown in FIG. 8$b$ as MCAP layer 827. MCAP layer 827 straddles over the die seal ring 823 (noting that the die seal ring includes metal wire 825$_2$), supported or at least separated from the top of the die seal ring 825$_2$ by a layer of dielectric 826$_2$, and electrically couples a wire 825$_1$ associated with the on die antenna and a wire 825$_3$ within the active device area. Thus, according to this structure, the "conductive channel" runs over the die seal ring rather than beneath the die seal ring as described with respect to FIG. 8$a$.

FIG. 9 shows another, alternative implementation in which the antenna wiring and die seal ring are structurally and electrically integrated with one another 904. Following the coil structure 904 of FIG. 9, note that an "absolute boundary" between the active device area 902 and the die edge 901 does not exist. That is, unlike the approach of FIG. 7, a path exists from the die edge 901 to the active device area 902 that does not cross a metal barrier. The integrated approach of FIG. 9 should result in smaller die size as compared to the non integrated approach of FIG. 7; which, in turn may result in lower per RFID tag production cost (because more RFID tags can be fabricated on a single wafer of silicon).

FIG. 10 shows a cross section of region 905 of FIG. 9. Comparing FIGS. 9 and 10, note that the innermost antenna wiring coil 1004$_1$ is coupled to a wire 1006 that runs directly into the active device area 1002. Hence, the coupling between the antenna and the active device area is made by straightforward interconnect metal rather than a conductive channel that runs above or below a traditional die seal ring. Nevertheless, the antenna wiring is effected (particularly with coil wires 1004$_2$ through 1004$_4$) with die-seal like structures (i.e., a stacked structure that includes a bar contact, bar vias and continuous interconnect wiring).

Because of the die-seal like structures used to construct the antenna coil wiring 1004, a good degree of structural preservation will still be imposed upon the features of the active device area. A conceivable failure mechanism is the introduction of a contaminant that is able to migrate "around-and-around" the open path from the die edge 1001 to the active device area 1002. Exposure to such a failure mechanism may be accounted for on a product-by-product basis (i.e., for some products the exposure may be acceptable while for others it may not be). Alternatively the exposure may be reduced through design such as, for example, passivating the die with a substance (e.g., wax) that serves as another barrier to contaminants as compared to the traditional passivation materials (e.g., Siliconoxynitride $SiO_xN_y$, Silicon Nitride $Si_3N_4$).

FIG. 10 shows the substrate regions beneath the coil wires (such as regions 1007$_1$ and 1007$_2$ for coil wire 1004$_4$) having at least a pair of PN junctions situated to prevent current flow in either direction (i.e., from coil wire to substrate; and, from substrate to coil wire). Prevention of current flow can be accomplished by viewing the pair of PN junctions as a pair of diodes and coupling the diodes such that their anodes are connected together; or, their cathodes are connected together. For example, if the wafer substrate 1009 is doped P type, region 1007$_2$ would be doped N type and region 1007$_1$ would be doped P type (alternatively, if the substrate 1009 is N type, region 1007$_2$ would be doped P type and region 1007$_1$ would be N type).

Arranging the PN junctions as described above can also be viewed as a vertical bipolar transistor. Here, the base region 1007$_2$ is intentionally left "open circuited" so that the transistor is permanently "off". Conceivably, additional pairs of PN junctions could be formed so that a pair of bipolar transistors each with an open base are stacked on top of each other (e.g., in the case of a second bipolar transistor, each of layers 1007$_1$ and 1007$_2$ would "divide" into two layers).

Here, in deciding the appropriate amount of coil wire/substrate isolation for any particular RFID tag design, consideration should be given to any large voltages that may appear on the antenna wiring (e.g., if an RFID tag with a large antenna may be placed close to a reader with a "strong" output signal). Alternatively, a DC bias may be applied to the antenna wiring so that current flow need only be prevented in one direction (e.g., from coil wire to substrate). In this case only a single reverse biased PN junction may be formed. However, RFID tags are typically designed such that the RFID tag die is powered from the energy received in the wireless signal received by the antenna. DC biasing of the antenna may be difficult or undesirable in these circumstances.

Regardless, if high antenna wiring voltages are not a concern and/or, owing to the electrical design surrounding the antenna, current flow between the die seal ring and substrate is only possible in one direction, then, in either or both of these cases, only a single reversed biased PN junction can be implemented (i.e., regions $1007_1$ and $1007$ "collapse" into a single layer). Here the layer between the coil wiring and the substrate should be doped opposite that of the substrate. Lastly, note that trench isolation structures are also shown in FIG. 10 (such as trench isolation region 1008) that act to thwart current flow laterally at or near the surface of the substrate 1009.

FIG. 11 indicates that structures other than die-seal like structures may be used to implement one or more coil wires 1104. Here, it is relevant to consider that a typical antenna is expected to propagate signals having high frequency components, and, that impedance matching is a consideration that should be taken into account. Impedance matching is a high frequency design objective that strives to match the impedance of a first component (e.g., the characteristic impedance of an antenna) with that of a second component (e.g., the input impedance of a demodulator or amplifier or filter), where, the two components are coupled together and are expected to propagate high frequency signals. Failure to impedance match along a signal path can result in unwanted "reflections" that may corrupt the high frequency components of the received wireless signal.

As such, the characteristic impedance of the antenna wiring should be addressed prior to finalizing its design. Those of ordinary skill will be able to correctly determine the characteristic impedance of a specific antenna wiring design. As such, a detailed discussion of antenna impedance matching need not be presently discussed. Nevertheless, it is important to point out that—generally—antenna wiring may be modeled with series inductance shunted on both sides by a capacitance. The specific inductance and capacitance values determine the antenna's characteristic impedance and are themselves determined by the physical layout of the antenna wiring itself.

Generally, the closer a pair of antenna wires are to one another the greater the capacitance, and, the greater the vertical stacking height of the antenna wiring the greater the capacitance. Here, the vertical stacking height of the antenna wiring is proportional to the number of bar vias and metal lines that are observed if a cross section of the antenna wiring is observed. It is therefore apparent that those of ordinary skill will be able to craft antenna wiring structures other than those that mimic or closely resemble a die-seal structure.

FIG. 11 shows one such example where antenna coils 1104 are only single layer wires. Here, note that the specific structure of FIG. 11 imposes a die-seal like structure at the inner most wire $1104_4$ from the die edge 1101. As such, structural integrity similar to that provided by a traditional die-seal should still be provided to the active device area 1101.

Note that the particular embodiment of FIG. 11 follows the "top-down" design approach of FIG. 7, but, unlike the cross sections of FIGS. 8a and 8b in which the antenna wiring was electrically isolated from the die seal ring, the cross section of FIG. 11 indicates that the die seal ring is electrically coupled to the antenna wiring through wire element 1110. Thus, like the approaches of FIGS. 9 and 10 (at least in the electrical sense) the die-seal ring is integrated with the antenna wiring itself. As such, there does not exist an embedded conductive channel above or below the traditional die seal structure. Here, because the die seal ring is electrically coupled to the antenna wiring, an "off" bipolar transistor is also observed beneath the die seal ring by way of layers $1107_1$ and $1107_2$ (similar to layers $1007_1$ and $1007_2$ of FIG. 10) in order to prevent current flow between the die seal ring and the substrate 1109.

FIG. 12 shows another integrated "on-die" antenna design that may be used in the alternative to the coil approach discussed above. The approach of FIG. 12 generally may be viewed as a dipole antenna having metal lines $1204_1$, $1204_2$ that "serpentine" back and forth along side one another off a side of the active device area. One or more regions of the antenna wire (e.g., one or more individual wire lengths that run the length of the active device area edge) may be built with stacked structures that mimic or resemble a die seal structure.

For simplicity no traditional die seal structure is shown in FIG. 12 (as such, electrical contact between the antenna wiring and the active device area 1202 may be made through standard metal interconnect). A traditional die seal structure may be implemented between the antenna wiring and the active device area, in which case, a conductive channel that runs above or below the traditional die seal structure such as those described above with respect to FIGS. 8a and 8b should be constructed. Alternatively, the die seal ring and the antenna may be shorted together where both are electrically isolated from the substrate (e.g., as depicted in FIGS. 10 and 11) by at least one reversed biased PN junction.

It should be understood that even though the term Radio Frequency (RF) in the acronym RFID tag can be construed to mean a specific frequency range (specifically, carrier frequencies within the RF range), if wireless semiconductor chip identification tags are feasible having a wireless frequency range that falls outside the RF range, then, term "RFID tag" should be understood to cover these identification tags as well.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   transmitting a wireless signal to a circuit die for a RFID tag, while said circuit die's positioning is under the control of a machine that transports said circuit die, to administer a functional test to said circuit die, said circuit die having an on-die antenna adapted to receive said wireless signal.

2. The method of claim 1 further comprising:
   obtaining one of a plurality of possible results of said functional test;
   selecting a distinct location from amongst a plurality of distinct locations, said selected distinct location corresponding to said obtained result;
   placing said circuit die in said selected distinct location.

3. The method of claim 2 wherein said selected distinct location is where scrap circuit dies are placed, said circuit die deemed to have failed said functional test.

4. The method of claim 2 wherein said selected distinct location is where circuit dies to be packaged are placed, said circuit die deemed to have passed said functional test.

5. The method of claim 4 further comprising packaging said circuit die after said placing.

6. The method of claim 4 further comprising:
transmitting a second wireless signal to a second circuit die for an RFID tag, while said second circuit die is in the grasp of said machine, to administer a second functional test to said second circuit die, said second circuit die having an on-die antenna adapted to receive said second wireless signal;
determining that said second circuit die has failed said second functional test; and,
placing said second circuit die in a second distinct location, said second distinct location being where scrap circuit dies are placed.

7. The method of claim 2 wherein said selected distinct location is where circuit dies to be used are placed, said RFID tag deemed to have passed said functional test.

8. The method of claim 2 wherein said selected distinct location is a starting location for a packaging process that packages said circuit die, said circuit die deemed to have passed said functional test.

9. The method of claim 2 wherein said selected distinct location is where circuit dies that are deemed marginally acceptable are placed, said circuit die deemed to have marginally passed said functional test.

10. The method of claim 1 wherein said machine is a pick-and-place machine.

11. The method of claim 10 wherein said transmitting a wireless signal further comprises transmitting a wireless signal from an antenna that is attached to said pick-and-place machine.

12. The method of claim 10 wherein other circuit dies yet to be picked and that were manufactured from a same wafer that said circuit die was manufactured from are not functionally tested with said wireless signal, said circuit die being closer than said other circuit dies to an antenna that transmits said wireless signal.

13. The method of claim 1 wherein other circuit dies yet to be picked and that were manufactured from a same wafer that said circuit die was manufactured from are not functionally tested with said wireless signal, said circuit die being closer than said other circuit dies to an antenna that transmits said wireless signal during said administering of said functional test.

14. The method of claim 1 wherein said circuit die has a die seal ring and said circuit die's on-die antenna is electrically isolated from said circuit die's die seal ring.

15. The method of claim 1 wherein said circuit die has an active device area and said circuit die's on-die antenna is electrically integrated with a stacked metallic structure, said stacked metallic structure to thwart penetration of contaminants into said circuit die's active device area.

16. The method of claim 15 wherein said stacked metallic structure comprises a wire, a bar contact and a bar via.

17. An apparatus, comprising:
a pick-and-place machine to pick a circuit die for an RFID tag and place said circuit die at a location, said circuit die having an on-die antenna; and,
a functional tester having an antenna, said antenna to transmit a wireless signal used to functionally test said circuit die while said circuit die is in the grasp of said pick-and-place machine.

18. The apparatus of claim 17 wherein said pick-and-place machine places said circuit die at said location via a trajectory, said functional tester being situated independently of said pick-and-place machine and having its antenna situated so as to test said circuit die while said circuit die passes a point along said trajectory.

19. The apparatus of claim 17 wherein said functional tester's antenna is attached to said pick-and-place machine.

20. The apparatus of claim 17 wherein said circuit die has a die seal ring and said circuit die's on-die antenna is electrically isolated from said circuit die's die seal ring.

21. The apparatus of claim 17 wherein said circuit die has an active device area and said circuit die's on-die antenna is electrically integrated with a stacked metallic structure, said stacked metallic structure to thwart penetration of contaminants into said circuit die's active device area.

22. A method, comprising:
a) picking a circuit die for an RFID tag from amongst a plurality of circuit dies manufactured from a same wafer, said circuit die having an on-die antenna;
b) transmitting a wireless signal to said circuit die to administer a functional test to said circuit die;
c) determining that said circuit die passed said functional test; and,
d) packaging said circuit die.

23. The method of claim 22 wherein said transmitting a wireless signal further comprises transmitting a wireless signal from an antenna that is attached to a pick-and-place machine that performs said picking.

24. The method of claim 22 wherein other circuit dies yet to be picked from said wafer are not functionally tested with said wireless signal, said circuit die being closer than said other circuit dies to an antenna that transmits said wireless signal.

25. The method of claim 22 wherein said circuit die has a die seal ring and said circuit die's on-die antenna is electrically isolated from said circuit die's die seal ring.

26. The method of claim 22 wherein said circuit die has an active device area and said circuit die's on-die antenna is electrically integrated with a stacked metallic structure, said stacked metallic structure to thwart penetration of contaminants into said circuit die's active device area.

27. The method of claim 22 wherein said circuit die has a stacked metallic structure and said stacked metallic structure comprises a bar contact and a bar via.

* * * * *